(12) United States Patent
Souri et al.

(10) Patent No.: US 6,188,556 B1
(45) Date of Patent: *Feb. 13, 2001

(54) TWO-TERMINAL TRANSISTOR PTC CIRCUIT PROTECTION DEVICES

(76) Inventors: Shukri Souri, 919 Mowry Ave. #41, Fremont, CA (US) 94536; Chris McCoy, 631 Catamaran St. Apt. #2, Foster City, CA (US) 94404; Hugh Duffy, 10565 San Leandro Ave., Cupertino, CA (US) 59014; Adrian I. Cogan, P.O. Box 522, San Carlos, CA (US) 94065; Ram G. Bommakanti, 33 Union Sq. Apt. 1122, Union City, CA (US) 94587

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/177,666

(22) Filed: Oct. 22, 1998

(51) Int. Cl.$^7$ ........................................... H02H 5/04
(52) U.S. Cl. ................................. 361/106; 361/58
(58) Field of Search ........................ 361/103, 106, 361/58; 307/39, 99, 100, 116, 117, 126, 131, 132 T; 327/371, 512

(56) References Cited

U.S. PATENT DOCUMENTS

| | | | |
|---|---|---|---|
| 3,708,720 | * 1/1973 | Whitney et al. | 361/103 |
| 3,884,080 | 5/1975 | Chapman | 73/399 |
| 4,041,276 | * 8/1977 | Schwarz et al. | 392/484 |
| 4,281,358 | 7/1981 | Plouffe et al. | 361/22 |
| 4,295,088 | * 10/1981 | Malchow | 323/313 |
| 5,381,296 | 1/1995 | Ekelund et al. | 361/106 |
| 5,684,663 | 11/1997 | Mitter | 361/106 |
| 5,763,929 | * 6/1998 | Iwata | 257/467 |

FOREIGN PATENT DOCUMENTS

| | | | |
|---|---|---|---|
| 2249463 | 5/1975 | (FR) | H02H/7/20 |
| WO 94/11937 | 5/1994 | (WO) | H02H/9/02 |

OTHER PUBLICATIONS

International Search Report for International Application No. PCT/US99/24716 dated Feb. 18, 2000.

* cited by examiner

Primary Examiner—Ronald W. Leja

(57) ABSTRACT

The present invention provides a two-terminal, transistor-PTC, circuit protection device that has a reduced size and weight and is particularly suitable for use, for example, in portable electronic devices and high density electronic circuits. According to one embodiment of the present invention, a circuit protection device comprises a positive coefficient temperature (PTC) element and a bipolar transistor having base, collector, and emitter terminals. The PTC element is connected between the base and collector terminals of the transistor. The PTC element may be thermally coupled to the transistor and packaged with the transistor as a hybrid device. An electrical load may be connected to the collector terminal of the transistor. According to another embodiment of the present invention, a circuit protection device comprises a PTC element and a Darlington circuit having base, collector and emitter terminals. The PTC element is connected between the base and collector terminals of the Darlington circuit. The PTC element may be thermally coupled to the Darlington circuit and packaged with the Darlington circuit as a hybrid device. An electrical load may be connected to the collector terminal of the Darlington circuit. The Darlington circuit may also be a complementary Darlington circuit.

12 Claims, 3 Drawing Sheets

TWO-TERMINAL TRANSISTOR PTC CIRCUIT PROTECTION DEVICES

BACKGROUND OF THE INVENTION

The present invention generally relates to electronic circuits, and more particularly to circuit protection devices comprising a resistor with a positive temperature coefficient (PTC), referred to as PTC_r, operating in combination with a semiconductor device.

PTC_r circuit protection devices are well known. The device is placed in series with a load, and under normal operating conditions, is in a low temperature, low resistance state. However, if the current through the PTC_r device increases excessively, and/or the ambient temperature around the PTC_r device increases excessively, then the PTC_r device will be "tripped," i.e., converted to a high resistance state such that the current is reduced substantially to a safe level. Generally, the PTC_r device will remain in the tripped state, even if the fault is removed, until the device has been disconnected from the power source and allowed to cool. After the current and/or temperature return to their normal levels, the PTC_r device will switch back to the low temperature, low resistance state.

An example of a PTC_r device is one that contains a PTC_r composition which is composed of a PTC conductive polymer. The largest steady state current which will not cause any of the devices in a batch of devices to trip is referred to as the "hold current" ($I_{hold}$), and the smallest steady state current which will cause all of the devices to trip is referred to as the "trip current" ($I_{trip}$). In general, the difference between $I_{hold}$ and $I_{trip}$ decreases slowly as the ambient temperature increases, and the higher the ambient temperature, the lower the hold current and the trip current.

PTC and semiconductor devices have been used together in electrical circuits. In some instances the PTC_r devices have been used to protect the semiconductor devices from overcurrent and/or overtemperature conditions. In other instances, the semiconductor and PTC_r devices have been used together to protect the circuits in which they reside from overcurrent and/or overvoltage conditions. In most cases, the PTC_r device is operated at its normal current and generally has a large size. The PTC_r devices of large size are not suitable for portable electronic devices to which size and weight are important. PTC_r devices of large size are also not suitable for high density electronics circuits.

It is desirable to reduce the size of the PTC_r circuit protection devices to allow them to be more suitably used in portable electronic devices and high density electronic circuits.

SUMMARY OF THE INVENTION

The present invention provides a circuit protection device that has a reduced size and weight and is particularly suitable for use, for example, in portable electronic devices and high density electronic circuits. According to one embodiment of the present invention, a circuit protection device comprises a positive coefficient temperature (PTC) element, and a bipolar junction transistor having base, collector, and emitter terminals. The PTC element is connected between the base and collector terminals of the transistor. The PTC element may be thermally coupled to the transistor and packaged with the transistor as a hybrid device. An electrical load may be connected to the collector terminal of the transistor. In a first embodiment of the invention, the transistor is of NPN type. In a second embodiment of the invention, the transistor is of PNP type.

According to another embodiment of the present invention, a circuit protection device comprises a PTC element and a Darlington circuit having base, collector and emitter terminals. The PTC element is electrically connected between the base and collector terminals of the Darlington circuit. The PTC element may be thermally coupled to the Darlington circuit and packaged with the Darlington circuit as a hybrid device. An electrical load may be connected to the collector terminal of the Darlington circuit. In a third embodiment of the invention, the Darlington circuit comprises two NPN type bipolar transistors. In a fourth embodiment of the invention, the Darlington circuit comprises two PNP type bipolar transistors.

Fifth and sixth embodiments of the invention are variations of the third and fourth embodiments. In each of the fifth and sixth embodiments of the invention, the Darlington circuit is a complementary Darlington circuit and comprises an NPN type bipolar transistor and a PNP type transistor.

A method for protecting an electrical load, according to the present invention, is also disclosed.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DETAILED DESCRIPTION OF THE PREFERRED EMBODIMENTS

Figure 1A:
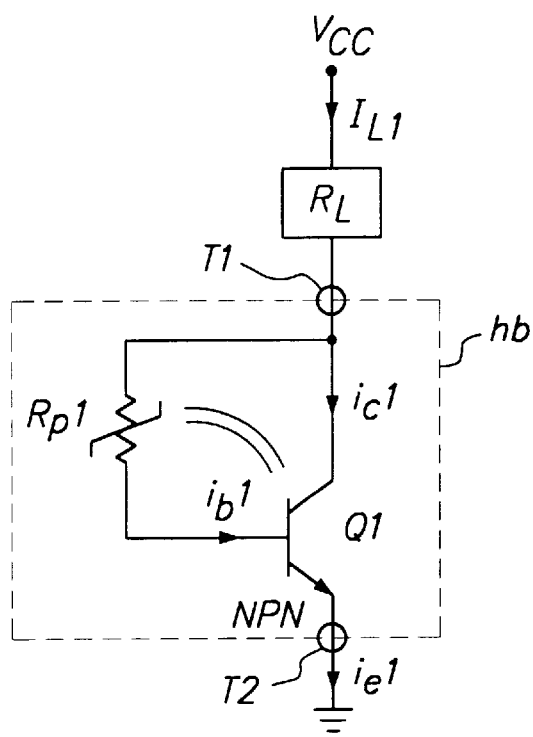
FIG. 1A shows a first embodiment according to the present invention.

FIG. 1A shows a first embodiment of the present invention. As illustrated in FIG. 1A, a positive temperature coefficient (PTC) resistor Rp1, is connected between base and collector terminals of an NPN bipolar transistor Q1. An electrical load RL, is connected between the collector terminal of transistor Q1 and a voltage source Vcc.

As an example, Rp1 my be a polymeric PTC resistor, such as a PolySwitch® device manufactured by Raychem Corporation, Menlo Park, Calif. The resistance value of Rp1 may change from, for instance, 1 ohm when the current flow in it is under its trip current of 1 amp to 100 Mohms when the current reaches the trip current. Its resistance value may also change from, for instance, 1 ohm at 25° C. to 100 Mohms at 150° C. PTC resistors of other types may also be used.

In this embodiment, under the normal conditions, the collector current $i_c1$ is β times the base current $i_b1$, which also flows in Rp1. Thus, one can use a PTC resistor rated with a smaller trip current as Rp1 to achieve an overall higher trip current for the circuit. This reduces the area of the overall circuit by a factor of approximately β times. The weight of the overall circuit is likewise reduced.

When there is an overcurrent, Rp1 will trip, causing transistor Q1 to turn off. Thus, no current flows in transistor Q1 and load RL. Therefore, both the transistor and the load are protected by Rp1 from overcurrent.

For a typical power transistor, such as a 2N3055 manufactured by several semiconductor companies, the β is 30 for small signals and between 10 and 15 for large signals. Therefore, if the trip current of Rp1 is 1 A, it will trip and become a very large resistance when the base current $i_b1$ is 1 A, and the collector, or load, current $i_c1$ is between 10 and 15 A. Thus, by using only a PTC resistor with a 1 A trip current, this two-terminal T1, T2 device acts like a PTC resistor with a 10 to 15 A trip current.

In the above embodiment, Rp1 may also be thermally coupled to bipolar transistor Q1 (shown by two symmetrically curved lines between Rp1 and Q1 in FIG. 1) to prevent the transistor from being overheated, in addition to tripping on overcurrent. Thus, if transistor Q1 begins to overheat, for example, due to excessive current through the transistor, heat energy from the transistor heats Rp1, causing Rp1 to increase in resistance, thereby limiting the current flowing in the base terminal of Q1 and thus turning off Q1. The thermal coupling improves the speed of protection and causes Rp1 to trip sooner. In this embodiment, Rp1 and Q1 may also be packaged as a hybrid device hb.

Figure 1B:
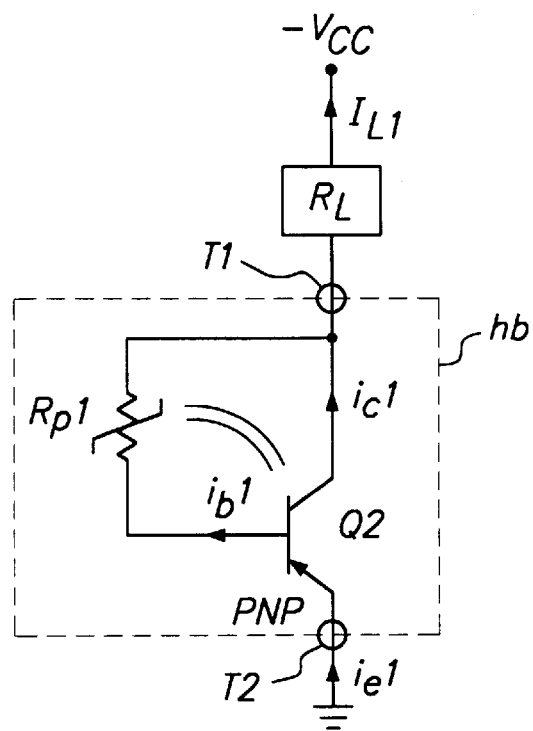
FIG. 1B shows a second embodiment according to the present invention.

FIG. 1B shows a second embodiment of the invention. This is a variation of the first embodiment shown in FIG. 1A. In this embodiment, a PNP bipolar transistor Q2 is used in place of the NPN bipolar transistor Q1 in FIG. 1A, and is connected to PTC resistor Rp1. Rp1 may also be thermally coupled to transistor Q2 and packaged together as a hybrid device.

The second embodiment operates in a manner similar to that of the first embodiment shown in FIG. 1A. That is, assuming p of transistor Q2 is between 10 to 15, the two-terminal device shown in FIG. 1B acts like a PTC resistor having a 10 to 15 A trip current, when a PTC resistor with only 1 A trip current is used as Rp1, as more clearly illustrated in FIG. 1C.

Figure 1C:
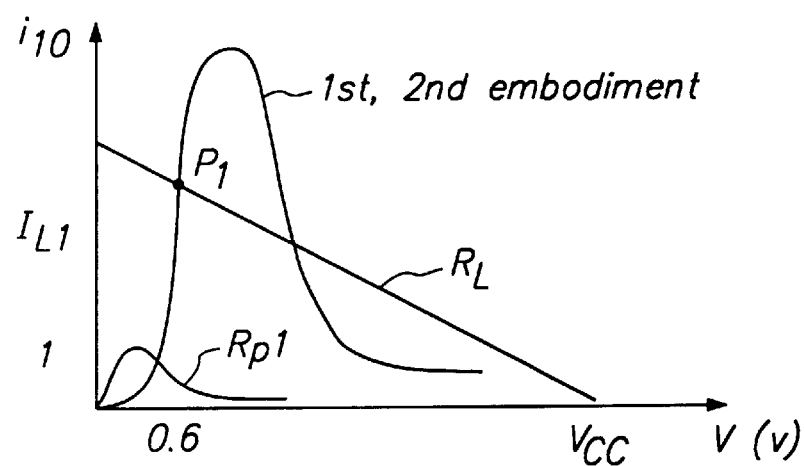
FIG. 1C is graph showing the current and voltage characteristics of the first and second embodiments.

FIG. 1C is a graph showing the current and voltage characteristics of the first and second embodiments of the invention. The i-v curves for PTC resistor Rp1 and the first and second embodiments are illustrated in FIG. 1C, in addition to the load line for RL. In this graph, it is assumed that the trip current of the two-terminal device in each of the first and second embodiments is 10 A and the trip current of the PTC resistor Rp1 is 1 A. The intersection point P1 is the operating point at which the circuits in FIGS. 1A and 1B operate.

Figure 2A:
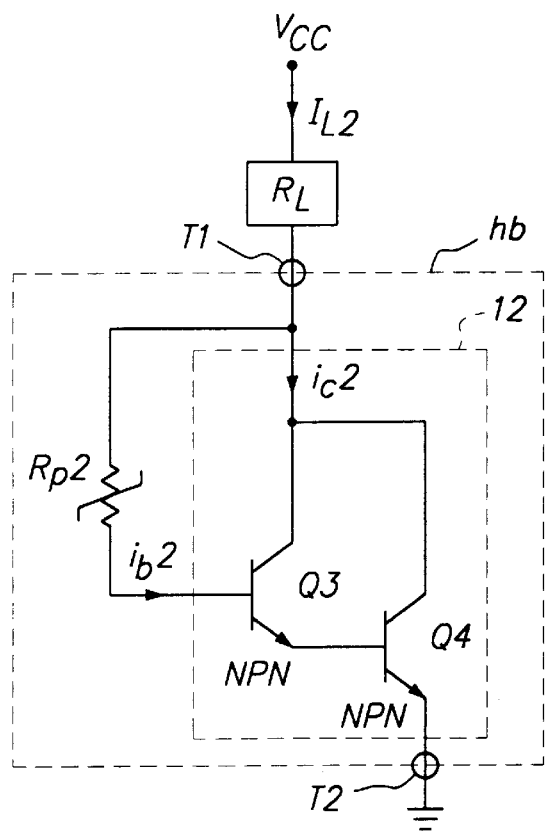
FIG. 2A shows a third embodiment according to the present invention.

FIG. 2A shows a third embodiment of the present invention. As illustrated in FIG. 2A, a PTC resistor Rp2 is connected between the base and collector terminals of a Darlington circuit 12. An electrical load RL, is coupled between the collector terminal of Darlington circuit 12 and a voltage source Vcc. In this embodiment, Rp2, as is Rp1 in the first embodiment, may be a polymeric PTC resistor or any other type of PTC resistor. Darlington circuit 12 comprises two NPN bipolar transistors Q3 and Q4.

In the third embodiment, the current that flows in Rp2 also flows into the base terminal of Darlington circuit 12. Under the normal conditions, the collector current $i_c2$ of Darlington circuit 12 is β times the base current $i_b2$. Thus, one can use a PTC resistor rated with a much smaller trip current as Rp2 to achieve a high trip current for the overall circuit shown in FIG. 2A since the β value of Darlington circuit 12 is the product of the respective β values of transistors Q3 and Q4. As an example, if transistors Q3 and Q4 each have a β value of 10 to 15, the β value of Darlington circuit 12 is of 100 to 225. Thus, the two-terminal device shown in FIG. 2A acts like a PTC resistor having a 10 to 23 A trip current, when a PTC resistor with only 0.1 A trip current is used. This reduces the size of the overall circuit by a significant factor of approximately the product of the two β values. The weight of the overall circuit is also significantly reduced.

When there is an overcurrent, Rp2 will trip, causing transistor Q3 and therefore Darlington circuit 12 to turn off. Thus, no current flows in Darlington circuit 12 and load RL. Therefore, both the Darlington circuit and the load are protected by Rp2 from overcurrent.

In this third embodiment, Rp2 may also be thermally coupled to Darlington circuit 12 to prevent the Darlington circuit from being overheated, in addition to tripping on overcurrent. Thus, if Darlington circuit 12 begins to overheat, for example, due to excessive current through the circuit, heat energy from the Darlington circuit heats Rp2, causing Rp2 to increase in resistance, thereby limiting the current flowing in the base terminal of Darlington circuit 12 and thus turning off the Darlington circuit. The thermal coupling improves the speed of protection and causes Rp2 to trip sooner. In this embodiment, Rp2 and Darlington circuit 12 may also be packaged as a hybrid device hb.

Figure 2B:
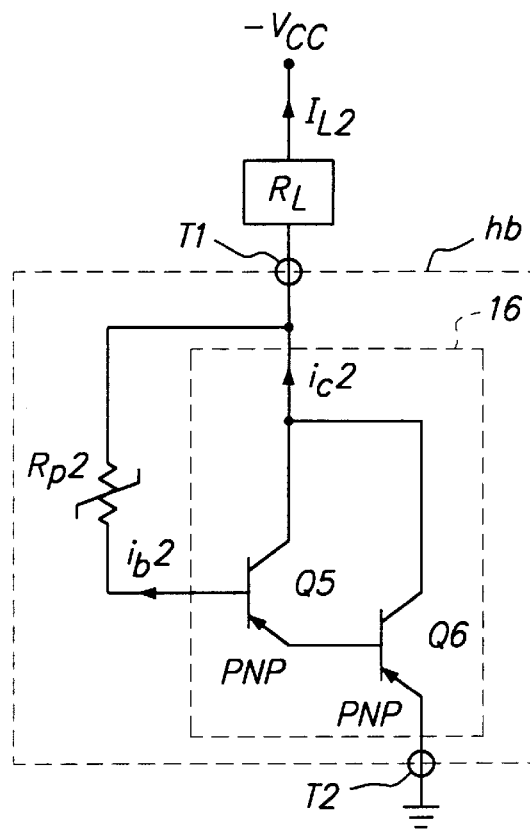
FIG. 2B shows a fourth embodiment according to the present invention.

FIG. 2B shows a fourth embodiment of the present invention. This is a variation of the third embodiment shown in FIG. 2A. In this embodiment, a Darlington circuit 16 comprising two PNP bipolar transistors Q5 and Q6 is used instead of Darlington circuit 12 in FIG. 2A. A PTC resistor Rp2 is connected between the base and collector terminals of Darlington circuit 16. Rp2 may also be thermally coupled to Darlington circuit 16 and packaged together as a hybrid device hb.

The fourth embodiment operates in a manner similar to that of the third embodiment shown in FIG. 2A. That is, if PNP bipolar transistors Q5 and Q6 each have a β value between 10 and 15, the β value of Darlington circuit 16 is between 100 and 225. The two-terminal device shown in FIG. 2B acts like a PTC resistor having a 10 to 23 A trip current when a PTC resistor with only 0.1 A trip current is used as Rp2, as more clearly illustrated in FIG. 2C.

Figure 2C:
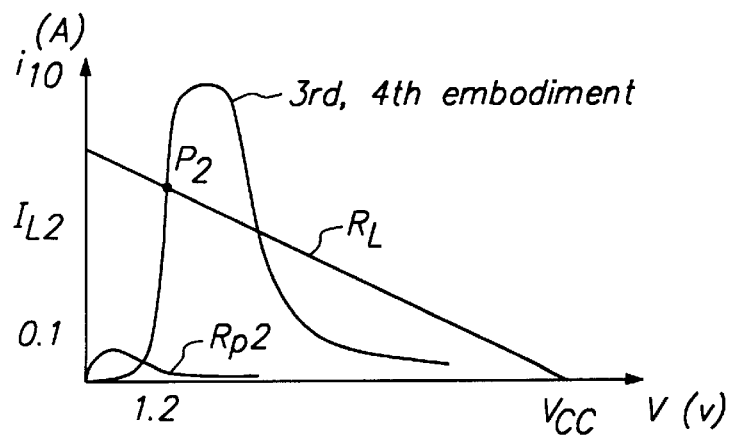
FIG. 2C is graph showing the current and voltage characteristics of the third and fourth embodiments.

FIG. 2C is a graph showing the current and voltage characteristics of the third and fourth embodiments of the invention. The i-v curves for PTC resistor Rp2 and the third and fourth embodiments are illustrated in FIG. 2C, in addition to the load line for RL. In the graph, it is assumed that the trip current of the two-terminal device in each of the third and fourth embodiments is 10 A and the trip current of PTC resistor Rp2 is 0.1 A. The intersection point P2 is the operating point at which the circuits in FIGS. 2A and 2B operate.

Figures 3A, 3B:
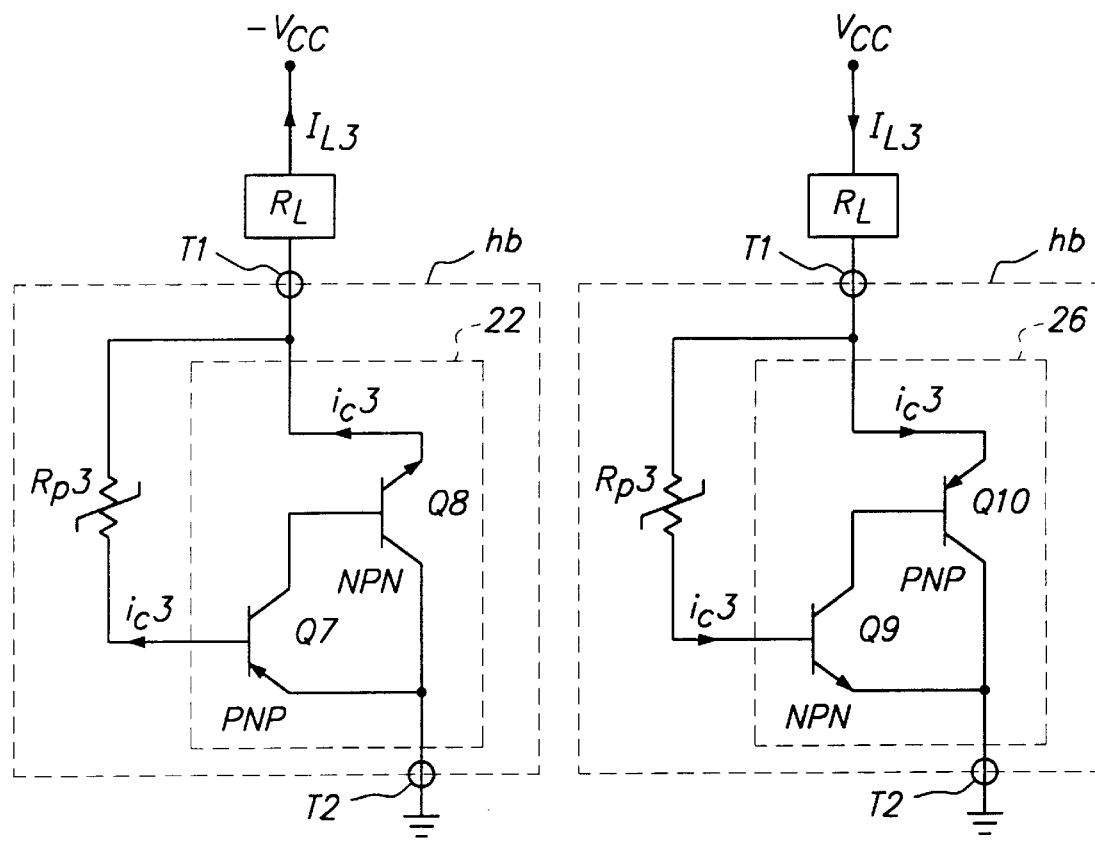
FIG. 3A shows a fifth embodiment according to the present invention.
FIG. 3B shows a sixth embodiment according to the present invention.

FIG. 3A shows a fifth embodiment of the present invention. As illustrated, a PTC resistor Rp3 is connected between base and collector terminals of a complementary Darlington circuit 22. An electrical load RL is connected between the collector terminal of Darlington circuit 22 and a voltage source Vcc. In this embodiment, Rp3, as is Rp1 in the first embodiment, may be a polymeric PTC resistor or any other type of PTC resistor. Darlington circuit 22 comprises a PNP bipolar transistor Q7 and an NPN bipolar transistor Q8.

In the fifth embodiment, as in the third embodiment, one can use a PTC resistor rated with a much smaller trip current as Rp3 to achieve a high trip current for the overall circuit shown in FIG. 3A since the β value of Darlington circuit 22 is the product of the respective β values of transistors Q7 and Q8. β values vary over a wide range, depending upon the transistor's rating, etc. For instance, if transistors Q7 and Q8 each have a β value of 10 to 15, the β value of Darlington circuit 22 is between 100 and 225. Thus, the two-terminal device shown in FIG. 3A acts like a PTC resistor having a 10 to 23 A trip current, when a PTC resistor with only a 0.1 A trip current is used. This embodiment provides a higher current gain than the third embodiment shown in FIG. 3A since the Darlington circuit 22 has a reduced Vbe across its base and emitter terminals. The voltage Vbe of Darlington circuit 22 is about 0.6 V, which is smaller than the 1.2 V Vbe of Darlington circuit 12 in the third embodiment. Consequently, the size and weight of the overall circuit are less than those of the circuit in the third embodiment.

When there is an overcurrent, Rp3 will trip, causing Darlington circuit 22 to turn off. Thus, no current flows in Darlington circuit 22 and load RL. Therefore, both the Darlington circuit and the load are protected by Rp3 from overcurrent.

In this fifth embodiment, Rp3 may also be thermally coupled to Darlington circuit 22 to prevent the Darlington circuit from being overheated, in addition to tripping on overcurrent. Thus, if Darlington circuit 22 begins to overheat, for example, due to excessive current through the circuit, heat energy from the Darlington circuit heats Rp3, causing Rp3 to increase in resistance, thereby limiting the current flowing in the base terminal of Darlington circuit 22 and thus turning off the Darlington circuit. The thermal coupling improves the speed of protection and causes Rp3 to trip sooner. In this embodiment, Rp3 and Darlington circuit 22 may also be packaged as a hybrid device hb.

FIG. 3B shows a sixth embodiment of the present invention. This is a variation of the fifth embodiment shown in FIG. 3A, with the positions of the two transistors Q7 and Q8 being switched. In this embodiment, a PTC resistor Rp3 is connected between the base and collector terminals of Darlington circuit 26, which comprises an NPN bipolar transistor Q9 and a PNP bipolar transistor Q10. Rp3 may also be thermally coupled to Darlington circuit 26 and packaged together as a hybrid device hb.

The sixth embodiment operates in a manner similar to that of the fifth embodiment shown in FIG. 3A. That is, if transistors Q9 and Q10 each have a β value between 10 and 15, the β value of Darlington circuit 26 is between 100 and to 225. The two-terminal device shown in FIG. 3B acts like a PTC resistor having a 10 to 23 A trip current when a PTC resistor with only 0.1 A trip current is used as Rp3, as more clearly illustrated in FIG. 3C.

Figure 3C:
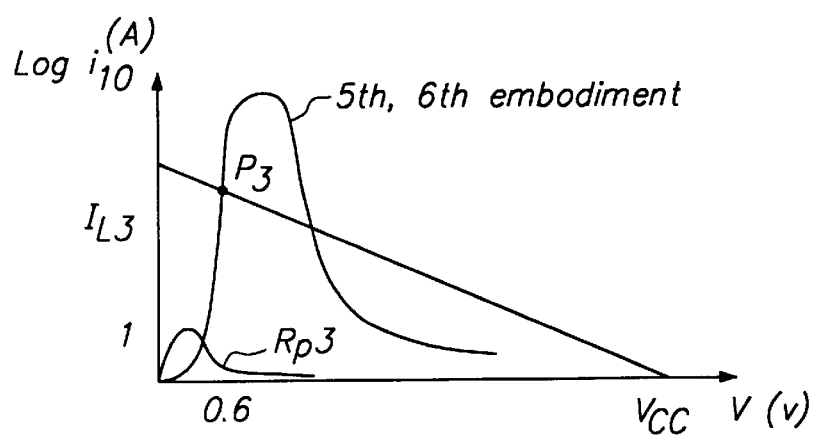
FIG. 3C is graph showing the current and voltage characteristics of the fifth and sixth embodiments.

FIG. 3C is a graph showing the current and voltage characteristics of the fifth and sixth embodiments of the invention. The i-v curves for PTC resistor Rp3 and the fifth and sixth embodiments are illustrated in FIG. 3C, in addition to the load line for RL. In the graph, it is assumed that the trip current of the two-terminal device in each of the third and fourth embodiments is 10 A and the trip current of PTC resistor Rp3 is 0.1 A. The intersection point P3 is the operating point at which the circuits in FIGS. 3A and 3B operate.

While the invention has been described in conjunction with several specific embodiments, it is evident to those skilled in the art that many further alternatives, modifications, applications and variations will be apparent in light of the foregoing description. Thus, the invention described herein is intended to embrace all such alternatives, modifications, applications and variations as may fall within the spirit and scope of the appended claims.

What is claimed is:

1. A two-terminal, transistor-PTC circuit protection device for protecting an electrical load against a predetermined overcurrent within a series network including the two-terminal device, the load and a direct current power supply, the device comprising:

a hybrid package having a first terminal and a second terminal, one said terminal being connected to the load and the other said terminal being connected to the power supply;

a positive temperature coefficient (PTC) element within the hybrid and having first and second ends and having a trip current and a trip state high resistance; and a bipolar transistor within the hybrid package, selected to provide a pass current sufficient to pass said predetermined overcurrent through said two-terminal device, having a base terminal electrically connected to the first end of the PTC element, a collector terminal connected to the second end of the PTC element and to the first terminal of the hybrid package so that base bias current flows from the collector terminal to the base terminal through the PTC element, and an emitter terminal connected to the second terminal of the hybrid package;

wherein said PTC element trip current is selected to correspond to a base current of said transistor resulting when said predetermined overcurrent passes through said two-terminal device and wherein said trip state high resistance reduces said base current and said pass current to a level significantly below said overcurrent such that said bipolar transistor effectively amplifies a pass current transfer characteristic of the PTC element.

2. The two-terminal device of claim 1 wherein said PTC element is thermally coupled to said transistor.

3. The two-terminal device of claim 1 wherein the electrical load is connected to the first terminal of said hybrid package.

4. The two-terminal device of claim 1 wherein said transistor is of NPN type.

5. The two-terminal device of claim 1 wherein said PTC element comprises a polymeric PTC resistor.

6. The two-terminal device of claim 1 wherein electrical resistance of said PTC element increases by a factor of approximately 100,000,000 when the base current of the transistor reaches the trip current of the PTC element.

7. A two-terminal, Darlington bipolar transistor-PTC circuit protection device for protecting an electrical load against a predetermined overcurrent within a series network including the two-terminal device, the load and a direct-current power supply, the device comprising:

a hybrid package having a first terminal and a second terminal, one said terminal being connected to the load and the other said terminal being connected to the power supply;

a positive temperature coefficient (PTC) element within the hybrid package and having first and second ends and having a trip current and a trip state high resistance; and a Darlington bipolar transistor circuit within the hybrid package, selected to provide a pass current sufficient to pass said predetermined overcurrent through said two-terminal device, having a base terminal electrically connected to the first end of the PTC element, a collector terminal connected to the second end of the PTC element and to the first terminal of the hybrid package so that base bias current flows from the collector terminal to the base terminal through the PTC element, and an emitter terminal connected to the second terminal of the hybrid package;

wherein said PTC element has a trip current selected to correspond to a base current of said Darlington bipolar transistor circuit resulting when said predetermined overcurrent passes through said two-terminal device and wherein said trip state high resistance reduces said base current and said pass current to a level significantly below said overcurrent such that said Darlington bipolar transistor circuit effectively amplifies a pass current transfer characteristic of the PTC element.

8. The two-terminal device of claim 7 wherein said PTC element is thermally coupled to said Darlington bipolar transistor circuit.

9. The two-terminal device of claim 7 wherein the electrical load is connected to the first terminal of said two-terminal device.

10. The two-terminal device of claim 7 wherein said Darlington bipolar transistor circuit comprises two NPN type bipolar transistors.

11. The two-terminal device of claim 7 wherein said PTC element comprises a polymeric PTC resistor.

12. The two-terminal device of claim 7 wherein electrical resistance of said PTC element increases by a factor of approximately 100,000,000 when the base current of the Darlington bipolar transistor circuit reaches the trip current of the PTC element.

* * * * *